United States Patent
Ogawa et al.

(10) Patent No.: US 8,289,053 B2
(45) Date of Patent: Oct. 16, 2012

(54) COMPARATOR CIRCUIT AND DISPLAY DEVICE PROVIDED WITH THE SAME

(75) Inventors: Yasuyuki Ogawa, Osaka (JP); Christopher Brown, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 99 days.

(21) Appl. No.: 12/737,023

(22) PCT Filed: Mar. 17, 2009

(86) PCT No.: PCT/JP2009/055174
§ 371 (c)(1),
(2), (4) Date: Dec. 2, 2010

(87) PCT Pub. No.: WO2010/013508
PCT Pub. Date: Feb. 4, 2010

(65) Prior Publication Data
US 2011/0068829 A1      Mar. 24, 2011

(30) Foreign Application Priority Data
Jul. 30, 2008   (JP) .................................. 2008-196147

(51) Int. Cl.
*H03K 5/22* (2006.01)
(52) U.S. Cl. ................. 327/65; 327/64; 327/67
(58) Field of Classification Search .......... 327/54, 327/55, 57, 63–65, 67
See application file for complete search history.

(56) References Cited

U.S. PATENT DOCUMENTS 6,462,585 B1 * 10/2002 Bernstein et al. ............... 327/65
7,679,428 B2 * 3/2010 Nozawa et al. ............... 327/534
2002/0113270 A1   8/2002 Bernstein et al.
2004/0189373 A1   9/2004 Sekigawa et al.
2007/0035334 A1   2/2007 Koike

FOREIGN PATENT DOCUMENTS

| EP | 0 840 452 | 5/1998 |
| JP | 04-070003 | 3/1992 |
| JP | 08-116242 | 5/1996 |
| JP | 2001-085988 | 3/2001 |

(Continued)

OTHER PUBLICATIONS

English translation of Russian Decision on Grant dated Nov. 10, 2011.

(Continued)

*Primary Examiner* — Long Nguyen
(74) *Attorney, Agent, or Firm* — Harness, Dickey & Pierce, P.L.C.

(57) ABSTRACT

An inverter is configured by double gate TFTs, and an inverter is configured by double gate TFTs. Top gate terminals of the TFTs that configure the inverter are connected to an input terminal DAT(+), and bottom gate terminals are connected to an output of the inverter and an output terminal OUT. Bottom gate terminals of the TFTs that configure the inverter are connected to an input terminal DAT(−), and bottom gate terminals are connected to an output of the inverter. With this, threshold voltages of the inverters are controlled so as to facilitate switching operations of the inverters, and whereby the comparator circuit operates at a high speed. It is possible to obtain a comparator circuit that is insusceptible to a variation in the threshold voltages of the transistors and fluctuation of a common mode voltage of an input signal and capable of operating at a high speed.

7 Claims, 11 Drawing Sheets

FOREIGN PATENT DOCUMENTS

| | | |
|---|---|---|
| JP | 2002-118446 | 4/2002 |
| JP | 2007-053729 | 3/2007 |
| JP | 2007-157986 | 6/2007 |
| SU | 1126943 | 11/1984 |
| SU | 1688398 | 10/1991 |

OTHER PUBLICATIONS

International Search Report.

M. Bazes, "Two Novel Fully Complementary Self-Biased CMOS Differential Amplifiers", IEEE Journal of Solid-State Circuits, vol. 26, No. 2, pp. 165-168, Feb. 1991.

Roy, K. et al., "Double-Gate SOI Devices for Low-Power and High Performance Applications," IEEE, pp. 217-224, 2005.

English translation of Japanese Decision on Grant dated Jun. 26, 2012.

* cited by examiner

CHANGE IN THRESHOLD
VOLTAGE OF INVERTER 15

AMPLFICATION OF INPUT
VOLTAGE V2 BY INVERTER 16

AMPLFICATION OF INPUT
VOLTAGE V1 BY INVERTER 15

CHANGE IN THRESHOLD
VOLTAGE OF INVERTER 16

COMPARATOR CIRCUIT AND DISPLAY DEVICE PROVIDED WITH THE SAME

TECHNICAL FIELD

The present invention relates to a comparator circuit that compares two input voltages and a display device provided with the comparator circuit.

BACKGROUND ART

As one method of downsizing and reducing power consumption of a liquid crystal display device, there is known a method of integrally forming pixel circuits and a drive circuit for the pixel circuits on the same substrate. When using this method, the drive circuit is configured by thin-film transistors (hereinafter referred to as TFTs) made of such as low-temperature polysilicon and CG silicon (Continuous Grain Silicon).

On the other hand, in order to improve the reliability of the liquid crystal display device, it is preferable to reduce the number of signal lines connected to a liquid crystal panel. Therefore, there is also known a method of using a serial interface for a signal input to the liquid crystal panel (see FIG. 15). A liquid crystal display device illustrated in FIG. 15 is provided with a liquid crystal panel 71 in which a pixel circuit 72, a drive circuit 73, and a serial interface circuit 74 are integrally formed on a glass substrate. The serial interface circuit 74 converts differential signals inputted from two input terminals DAT(+) and DAT(−) into non-differential signals, performs serial/parallel conversion, and outputs these signals to the drive circuit 73. The drive circuit 73 drives the pixel circuit 72 based on the signals outputted from the serial interface circuit 74. It should be appreciated that signals inputted through the serial interface are not limited to differential signals, and can be non-differential signals.

For example, using a parallel interface when inputting 6-bit video signals for RGB to the liquid crystal panel requires 18 signal lines for inputting the video signals. In contrast, when using the serial interface, only two (in the case of differential signals) or one (in the case of non-differential signals) signal line(s) are/is required for inputting video signals.

When using the serial interface, an input signal is required to change at a higher speed compared to the case in which the parallel interface is used. However, as a wiring delay (RC delay) occurs in a signal line connected to the liquid crystal panel, it is practically impossible to cause an input signal to the liquid crystal panel to change at a high speed. Consequently, when using the serial interface, it is necessary to reduce a voltage amplitude of the input signal to the liquid crystal panel. For example, a differential signal having amplitude of 200 mVp-p centering a common mode voltage Vcm is commonly used in LVDS (Low-Voltage Differential Signaling) as illustrated in FIG. 16, and it is also necessary to reduce the voltage amplitude of the input signal in this manner when the serial interface is used for the signal input to the liquid crystal panel.

In the following, a case in which a differential signal is used for the signal input to a liquid crystal panel is considered. In this case, in order to convert an inputted differential signal to a non-differential signal, a comparator circuit for comparing two voltages is provided for an input stage of the liquid crystal panel. An operation speed of the comparator circuit is heavily affected by characteristics (in particular, a threshold voltage) of transistors that configure the comparator circuit and a common mode voltage of the input signal.

As a comparator circuit that converts a differential signal to a non-differential signal, there has been known a comparator circuit as illustrated in FIG. 17. A comparator circuit 80 illustrated in FIG. 17 is a circuit based on a differential amplifier circuit, compares two voltages inputted from the two input terminals DAT(+) and DAT(−), and outputs a result of the comparison through an output terminal OUT at a power-supply voltage amplitude. The comparator circuit 80 provides an advantageous effect of operating at a high speed due to a high gain, but has a problem of being susceptible to fluctuation of the common mode voltage of the input signal (the operation speed easily changes as the common mode voltage changes).

Further, Non-Patent Document 1 describes an auto-bias comparator circuit illustrated in FIG. 18. A comparator circuit 90 illustrated in FIG. 18 is configured to include two inverters between two power supply wires, and transistors 95 and 96 which supply a bias voltage common to the two inverters are provided between the two power supply wires.

According to the comparator circuit 90, when a voltage supplied to the input terminal DAT(+) becomes greater than a voltage supplied to the input terminal DAT(−), a current that flows through a transistor 91 increases and a current that flows through a transistor 92 decreases. Consequently, a voltage of a bias node Nb decreases. With this, a current that flows through the transistor 96 increases, and an increase of a voltage of the output terminal OUT is facilitated. Along with this, a current that flows through the transistor 95 decreases, and a decrease of the voltage of the output terminal OUT is suppressed. As a result, the voltage of the output terminal OUT increases.

On the other hand, when the voltage supplied to the input terminal DAT (+) becomes smaller than the voltage supplied to the input terminal DAT (−), the current that flows through the transistor 91 decreases and the current that flows through the transistor 92 increases. Consequently, the voltage of the bias node Nb increases. With this, the current that flows through the transistor 95 increases, and a decrease of the voltage of the output terminal OUT is facilitated. Along with this, the current that flows through the transistor 96 decreases, and an increase of the voltage of the output terminal OUT is suppressed. As a result, the voltage of the output terminal OUT decreases. In this manner, the comparator circuit 90 compares the two input voltages.

Techniques related to the present invention are also described in documents listed below. Patent Document 1 describes an example of a signal level conversion circuit provided for an input stage of a liquid crystal panel. Patent Document 2 describes an example of a TFT having two gate terminals (double gate TFT).

[Patent Document 1] Japanese Laid-Open Patent
[Patent Document 2] Japanese Laid-Open Patent Publication No. 2007-157986
[Non-Patent Document 1] M. Bazes, "Two Novel Fully Complementary Self-Biased CMOS Differential Amplifiers", IEEE Journal of Solid-State Circuits, Vol. 26, No. 2, pp. 165-168, February 1991.

DISCLOSURE OF THE INVENTION

Problems to be Solved by the Invention

The comparator circuit 90 described above provides an advantageous effect of being comparatively insusceptible to the variation in the threshold voltages of the transistors, and being also insusceptible to the fluctuation of the common mode voltage of the input signals. However, the comparator circuit 90 has an asymmetric structure, and the bias voltage changes depending only on the output characteristic of one of the transistors (the inverter configured by the transistors 91 and 92). Consequently, the comparator circuit 90 is not able to follow a variation in threshold voltages of transistors 93 and 94 that configure the other inverter. There is also a problem that an operating range is limited by the threshold voltages of the transistors 95 and 96 that supply the bias voltage. Moreover, there is also a problem that, as the transistors 95 and 96 are provided between the power supply wires and the inverters, the operation speed becomes slower due to a parasitic resistance and a parasitic capacitance of the transistors 95 and 96. When using a comparator circuit with a lower operation speed, it is difficult to input signals to the liquid crystal panel using the serial interface.

Thus, an object of the present invention is to provide a comparator circuit that is insusceptible to a variation in threshold voltages of transistors and fluctuation of a common mode voltage of an input signal and capable of operating at a high speed, as well as a display device provided with such a comparator circuit.

Means for Solving the Problems

According to a first aspect of the present invention, there is provided a comparator circuit capable of comparing two input voltages, the circuit including: a first inverter to which a first input voltage is inputted, the first inverter having a structure in which a P-type transistor and an N-type transistor are connected in series between two power supply wires; and a second inverter to which a second input voltage is inputted, the second inverter having a structure that is identical with the structure of the first inverter, wherein at least one of the first and second inverters is configured by double gate transistors each having two gate terminals, and one of the gate terminals of each double gate transistor is applied with the input voltage and the other of the gate terminals is connected to an output of the other inverter.

According to a second aspect of the present invention, in the first aspect of the present invention, each of the first and second inverters is configured by the double gate transistors, one of the gate terminals of each double gate transistor that configures the first inverter is applied with the first input voltage, and the other of the gate terminals is connected to an output of the second inverter, and one of the gate terminals of each double gate transistor that configures the second inverter is applied with the second input voltage, and the other of the gate terminals is connected to an output of the first inverter.

According to a third aspect of the present invention, in the first aspect of the present invention, each of the first and second inverters is configured by the double gate transistors, both of the two gate terminals of each double gate transistor that configures the first inverter are applied with the first input voltage, and one of the gate terminals of each double gate transistor that configures the second inverter is applied with the second input voltage, and the other of the gate terminals is connected to an output of the first inverter.

According to a fourth aspect of the present invention, in the first aspect of the present invention, only the second inverter out of the first and second inverters is configured by the double gate transistors, and one of the gate terminals of each double gate transistor that configures the second inverter is applied with the second input voltage, and the other of the gate terminals is connected to an output of the first inverter.

According to a fifth aspect of the present invention, in the first aspect of the present invention, each of the first and second inverters is configured by thin-film transistors.

According to a sixth aspect of the present invention, in the fifth aspect of the present invention, each of the first and second inverters is configured by using the thin-film transistors on a substrate on which a pixel circuit is disposed.

According to a seventh aspect of the present invention, there is provided a display device formed on a substrate, the device including: a plurality of pixel circuits; a drive circuit for the pixel circuits; and an interface circuit that converts an externally inputted differential signal into a non-differential signal, and outputs the non-differential signal to the drive circuit, wherein the interface circuit includes a comparator circuit according to any one of the first to sixth aspects of the present invention, and performs conversion of the differential signal using the comparator circuit.

Effects of the Invention

According to the first aspect of the present invention, it is possible to configure a comparator circuit that is insusceptible to a variation in threshold voltages of the transistors and fluctuation of a common mode voltage of the input signal, using the two inverters that are connected to each other. Further, by configuring at least one of the two inverters by the double gate transistors, and connecting one of the gate terminals of each double gate transistor to the output of the other inverter, it is possible to control the threshold voltage of the inverter configured by the double gate transistors based on the output of the other inverter so as to facilitate a switching operation of the inverter, thereby causing the comparator circuit to operate at a high speed.

According to the second aspect of the present invention, by configuring the first and second inverters by the double gate transistors, and by connecting one of the gate terminals of each double gate transistor that configures the first inverter to the output of the second inverter and connecting one of the gate terminals of each double gate transistor that configures the second inverter to the output of the first inverter, it is possible to control the threshold voltages of the first and second inverters based on the output of the other inverter so as to facilitate the switching operations of the both inverters, thereby causing the comparator circuit to operate at a high speed.

According to the third aspect of the present invention, by configuring the first and second inverters by the double gate transistors, and by applying the first input voltage to the two of the gate terminals of each double gate transistor that configures the first inverter and connecting one of the gate terminals of each double gate transistor that configures the second inverter to the output of the first inverter, it is possible to control the threshold voltage of the first inverter based on the output of the first input voltage so as to facilitate the switching operation of the first inverter, and to control the threshold voltage of the second inverter based on the output of the first inverter so as to facilitate the switching operation of the second inverter, thereby causing the comparator circuit to operate at a high speed.

According to the fourth aspect of the present invention, by configuring the second inverter by the double gate transistors, and by connecting one of the gate terminals of each double gate transistor to the output of the first inverter, it is possible to control the threshold voltage of the second inverter based on the output of the first inverter so as to facilitate the switching operation of the second inverter, thereby causing the comparator circuit to operate at a high speed. Further, it is possible to simplify the structure of the comparator circuit.

According to the fifth aspect of the present invention, even when thin-film transistors in which the variation in the threshold voltage is comparatively large are used, it is possible to form the comparator circuit in a planar shape that is insusceptible to the variation in the threshold voltages of the transistors and the fluctuation of the common mode voltage of the input signal, and is capable of operating at a high speed.

According to a sixth aspect of the present invention, the comparator circuit that is insusceptible to the variation in the threshold voltages of the transistors and the fluctuation of the common mode voltage of the input signal and is capable of operating at a high speed can be integrally formed along with the pixel circuit on the substrate by using the thin-film transistor, and can be utilized for a display device.

According to the seventh aspect of the present invention, by providing the comparator circuit that is insusceptible to the variation in the threshold voltages of the transistors and the fluctuation of the common mode voltage of the input signal and is capable of operating at a high speed for the interface circuit formed on the substrate, it is possible to configure the display device capable of performing a signal input to the substrate at a high speed using the differential signal. Further, by performing the signal input to the substrate using a serial interface, it is possible to reduce the number of signal lines connected to the substrate, and to improve reliability of the display device.

Figure 1:
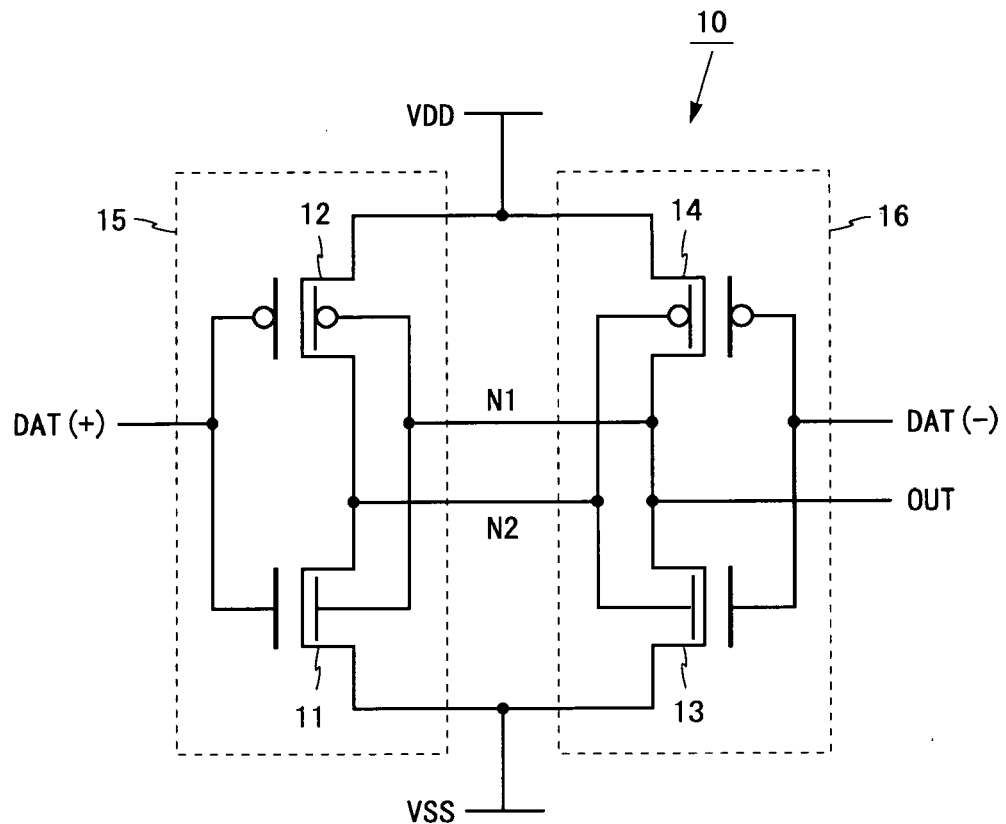
FIG. 1 is a circuit diagram of a comparator circuit according to a first embodiment of the present invention.

DESCRIPTION OF THE REFERENCE NUMERALS 1, 2, 11 to 14, 21 to 24 and 31 to 34: TFT
3, 15, 16, 25, 26, 35 and 36: INVERTER
10, 20 and 30: COMPARATOR CIRCUIT
40: LIQUID CRYSTAL DISPLAY DEVICE
41: LIQUID CRYSTAL PANEL
42: PIXEL CIRCUIT
43: TFT
44: GATE DRIVER CIRCUIT
45: SOURCE DRIVER CIRCUIT
50: SERIAL INTERFACE CIRCUIT

BEST MODE FOR CARRYING OUT THE INVENTION

First Embodiment

FIG. 1 is a circuit diagram of a comparator circuit according to a first embodiment of the present invention. A comparator circuit 10 illustrated in FIG. 1 is provided with two inverters configured by double gate TFTs, and compares two input voltages using the inverters. The comparator circuit 10 is provided for an input stage of a liquid crystal panel on which pixel circuits and a drive circuit for the pixel circuits are integrally formed, for example. Before describing the comparator circuit 10 in detail, the double gate TFT and the inverters configured by the double gate TFTs are described with reference to FIGS. 2 to 6.

Figure 2:
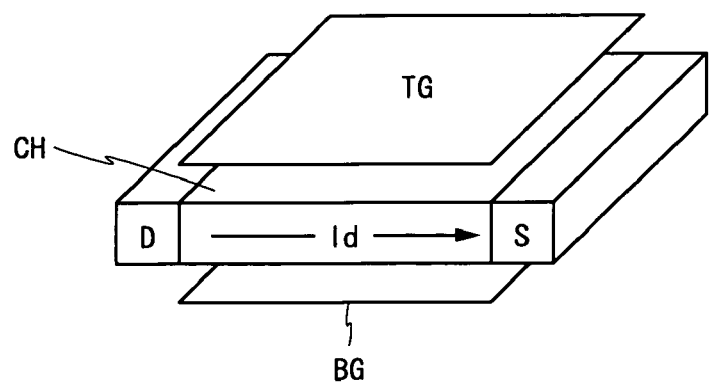
FIG. 2 is a schematic view illustrating a structure of a double gate TFT.
Figure 3A:
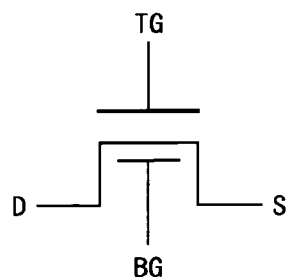
FIG. 3A is a diagram of an N-type double gate TFT represented by a circuit symbol.
Figure 3B:
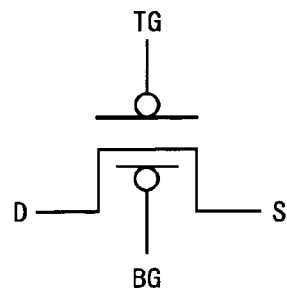
FIG. 3B is a diagram of a P-type double gate TFT represented by a circuit symbol.

The double gate TFT is one type of a multi-gate transistor, and characterized by two gate terminals. FIG. 2 is a schematic view illustrating a structure of the double gate TFT. In the double gate TFT, a source terminal S, a drain terminal D, and a channel forming portion CH between these terminals are disposed on the same plane. A top gate terminal TG is provided above the channel forming portion CH, and a bottom gate terminal BG is provided below the channel forming portion CH. A drain current Id that corresponds to voltages applied to the top gate terminal TG and the bottom gate terminal BG flows between the drain terminal D and the source terminal S. Using circuit symbols, an N-type double gate TFT is represented as shown in FIG. 3A, and a P-type double gate TFT is represented as shown FIG. 3B. The double gate TFT is typically formed such that inversion layer regions are disposed on top and bottom, and used to increase a capability of current driving.

Figure 4:
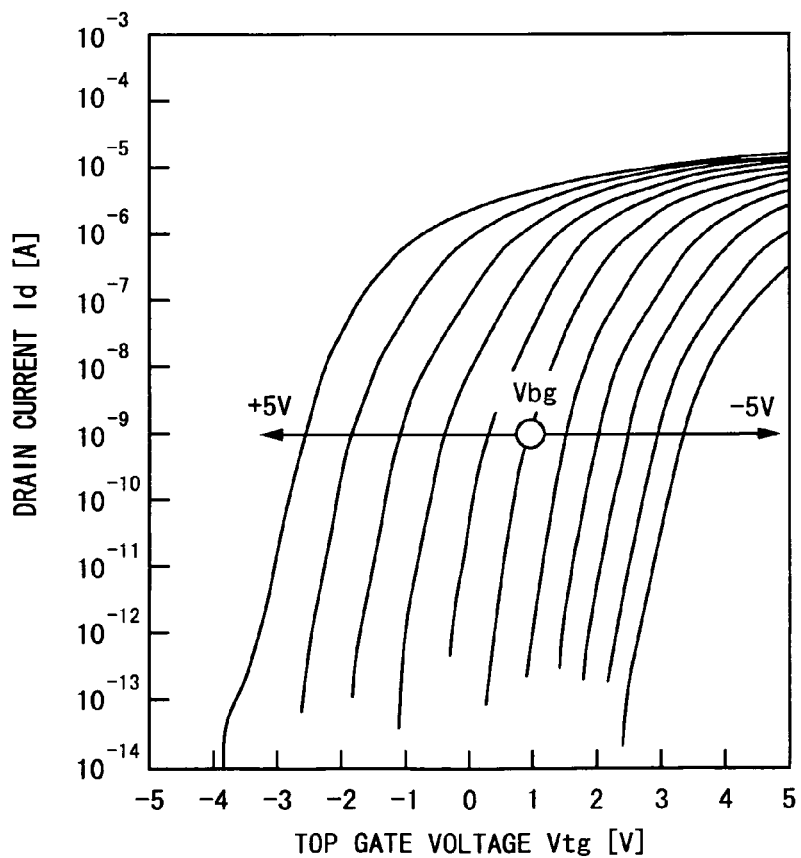
FIG. 4 is a chart showing an example of an I-V characteristic of the N-type double gate TFT.

FIG. 4 is a chart showing an example of an I-V characteristic of the N-type double gate TFT. FIG. 4 shows a relation between a top gate voltage Vtg and the drain current Id when a drain-source voltage Vds is fixed to a predetermined value (here, 0.1 V) and a bottom gate voltage Vbg changes. The drain current Id is substantially 0 when the top gate voltage Vtg is lower than a certain value (hereinafter referred to as a threshold voltage Vth), and increases sharply when the top gate voltage Vtg exceeds the threshold voltage Vth. The threshold voltage Vth becomes lower as the bottom gate voltage Vbg increases, and higher as the bottom gate voltage Vbg decreases. In this manner, in the N-type double gate TFT, the threshold voltage Vth of the transistor controlled using the top gate terminal can be changed by controlling the bottom gate voltage Vbg. This also applies to the P-type double gate TFT.

In general, it is possible to configure a CMOS inverter by serially connecting a P-type MOSFET (Metal Oxide Semiconductor Field Effect Transistor) and an N-type MOSFET, and providing these between two power supply wires. Likewise, it is possible to configure an inverter using the P-type double gate TFT and the N-type double gate TFT.

Figure 5A:
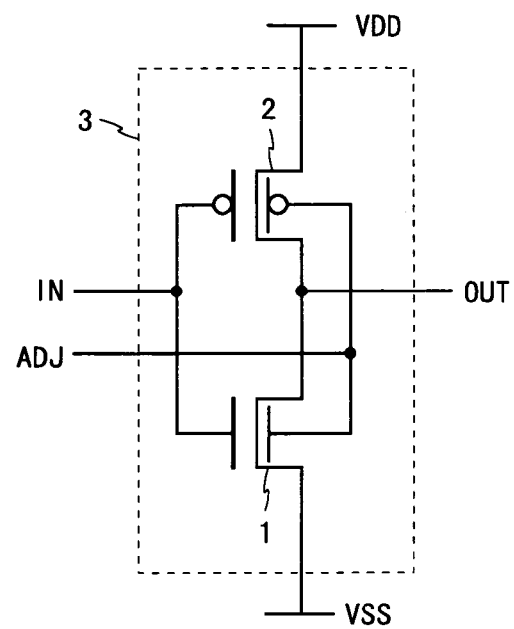
FIG. 5A is a circuit diagram of an inverter configured by the double gate TFTs.
Figure 5B:
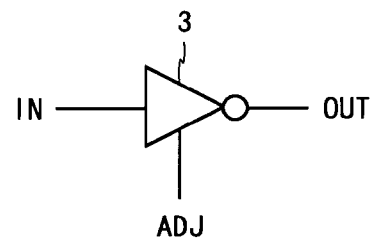
FIG. 5B is a diagram of the inverter illustrated in FIG. 5A represented by a circuit symbol.

FIG. 5A is a circuit diagram of the inverter configured by the double gate TFTs. An inverter 3 illustrated in FIG. 5A is provided with two TFTs 1 and 2, an input terminal IN, an output terminal OUT, and an adjustment terminal ADJ. The TFT 1 is an N-type double gate TFT and the TFT 2 is a P-type double gate TFT. A source terminal of the TFT 1 is connected to the power supply wire to which a low voltage VSS is applied, and a source terminal of the TFT 2 is connected to the power supply wire to which a high voltage VDD is applied. Top gate terminals of the TFTs 1 and 2 are both connected to the input terminal IN, drain terminals to the output terminal OUT, and back gate terminals to the adjustment terminal ADJ, respectively. The inverter 3 is represented as shown in FIG. 5B using a circuit symbol.

Figure 6:
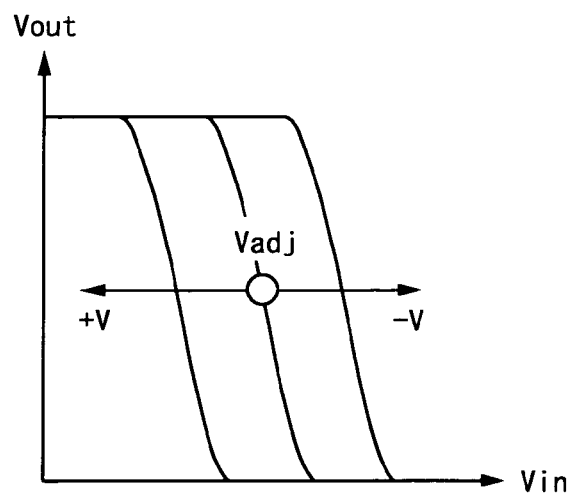
FIG. 6 is a chart showing input/output characteristics of the inverter illustrated in FIG. 5A.

FIG. 6 is a chart showing input/output characteristics of the inverter 3. FIG. 6 shows a relation between an input voltage Vin and an output voltage Vout when an adjustment voltage Vadj changes. As shown in FIG. 6, the output voltage Vout is at a predetermined level that is higher than 0 when the input voltage Vin is lower than the threshold voltage Vth, and is substantially 0 when the input voltage Vin exceeds the threshold voltage Vth. The threshold voltage Vth becomes lower as the adjustment voltage Vadj increases, and higher as the adjustment voltage Vadj decreases. According to the inverter 3, it is possible to change a switching point (a boundary voltage between an ON state and an OFF state) by controlling the bottom gate voltages of the TFTs 1 and 2.

The following describes the comparator circuit 10 in detail with reference to FIG. 1. The comparator circuit 10 illustrated in FIG. 1 is provided with four TFTs 11 to 14, two input terminals DAT(+) and DAT(−), and an output terminal OUT. The TFTs 11 and 13 are N-type double gate TFTs, and the TFTs 12 and 14 are P-type double gate TFTs. Source terminals of the TFTs 11 and 13 are connected to the power supply wire to which the low voltage VSS is applied, and source terminals of the TFTs 12 and 14 are connected to the power supply wire to which the high voltage VDD is applied. Drain terminals of the TFTs 11 and 12 are connected to each other and drain terminals of the TFTs 13 and 14 are both connected to the output terminal OUT. Top gate terminals of the TFTs 11 and 12 are both connected to the input terminal DAT(+), and bottom gate terminals are both connected to the drain terminals of the TFTs 13 and 14 and the output terminal OUT. Top gate terminals of the TFTs 13 and 14 are both connected to the input terminal DAT (−), and bottom gate terminals are both connected to drain terminals of the TFTs 11 and 12. In the following, a node to which the bottom gate terminal of the TFT 11 and such are connected is represented by N1, and a node to which the bottom gate terminal of the TFT 13 and such are connected is represented by N2.

In the comparator circuit 10, the TFTs 11 and 12 configure an inverter 15 and the TFTs 13 and 14 configure an inverter 16. An input terminal of the inverter 15 is connected to the input terminal DAT (+), and an output terminal is connected to an adjustment terminal of the inverter 16. An input terminal of the inverter 16 is connected to the input terminal DAT (−), and an output terminal is connected to an adjustment terminal of the inverter 15 and the output terminal OUT. A first input voltage V1 is supplied to the input terminal DAT (+), and a second input voltage V2 is supplied to the input terminal DAT (−). In this manner, it is possible to form a negative feedback loop that facilitates a switching operation in a complementary manner by connecting the inverters 15 and 16 to each other.

Figure 7A:
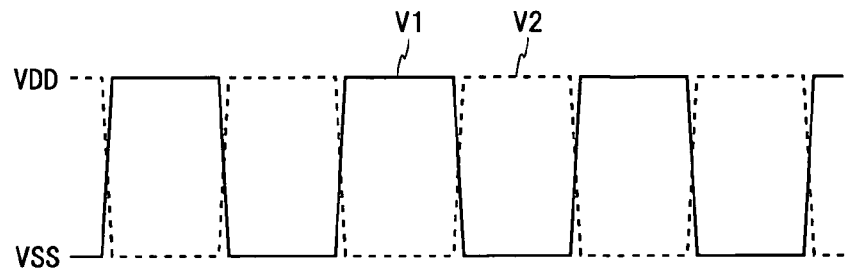
FIG. 7A is a signal waveform chart showing a digital signal inputted to the comparator circuit illustrated in FIG. 1.
Figure 7B:
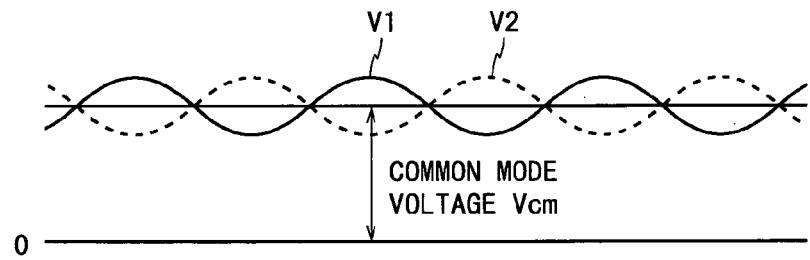
FIG. 7B is a signal waveform chart showing a differential signal inputted to the comparator circuit illustrated in FIG. 1.

A differential signal is inputted to the comparator circuit 10 using the two input terminals DAT (+) and DAT (−). To the comparator circuit 10, such as a pair of digital signals respectively changing in opposite directions (FIG. 7A) or differential signals with small amplitude (FIG. 7B), for example, is/are inputted. When inputting the digital signals, as shown in FIG. 7A, the first input voltage V1 becomes the high voltage VDD or the low voltage VSS, and the second input voltage V2 takes an opposite voltage. When inputting the differential signals with small amplitude, as shown in FIG. 7B, the first input voltage V1 and the second input voltage V2 change in opposite directions centering a common mode voltage Vcm. Alternatively, it is possible to input a non-differential signal to the comparator circuit 10. When inputting the non-differential signal, the non-differential signal is inputted to one of the two input terminals DAT(+) and DAT(−), and a reference voltage to be compared is inputted to the other.

As described below, the comparator circuit 10 outputs, as an output voltage VO, the high voltage VDD when the first input voltage V1 is greater than the second input voltage V2 (V1>V2), and the low voltage VSS when the first input voltage V1 is smaller than the second input voltage V2 (V1<V2).

First, a case of V1>V2 due to an increase of the first input voltage V1 and a decrease of the second input voltage V2 is considered. When the first input voltage V1 increases, the TFT 11 is turned to an ON state and the TFT 12 is turned to an OFF state, and a voltage of the node N2 (the output voltage of the inverter 15) decreases. As the node N2 is connected to the adjustment terminal of the inverter 16, a threshold voltage of the inverter 16 increases when the voltage of the node N2 decreases. Consequently, the output voltage of the inverter 16 also increases. Along with this, when the second input voltage V2 decreases, the TFT 13 is turned to the OFF state and the TFT 14 is turned to the ON state, and a voltage of the node N1 (the output voltage of the inverter 16) increases. As the node N1 is connected to the adjustment terminal of the inverter 15, a threshold voltage of the inverter 15 decreases when the voltage of the node N1 increases. Consequently, the output voltage of the inverter 15 also decreases. The decrease of the output voltage of the inverter 15 facilitates the increase of the output voltage of the inverter 16, and the increase of the output voltage of the inverter 16 facilitates the decrease of the output voltage of the inverter 15. Therefore, the output voltage VO changes to the high voltage VDD in a short period of time.

Next, a case of V1<V2 due to a decrease of the first input voltage V1 and an increase of the second input voltage V2 is considered. When the first input voltage V1 decreases, the TFT 11 is turned to the OFF state and the TFT 12 is turned to the ON state, and the voltage of the node N2 increases. Consequently, the threshold voltage of the inverter 16 decreases, and the output voltage of the inverter 16 also decreases. Along with this, when the second input voltage V2 increases, the TFT 13 is turned to the ON state and the TFT 14 is turned to the OFF state, and the voltage of the node N1 decreases. Consequently, the threshold voltage of the inverter 15 increases, and the output voltage of the inverter 15 also increases. The increase of the output voltage of the inverter 15 facilitates the decrease of the output voltage of the inverter 16, and the decrease of the output voltage of the inverter 16 facilitates the increase of the output voltage of the inverter 15. Therefore, the output voltage VO changes to the low voltage VSS in a short period of time. In this manner, both in the case of V1>V2 and the case of V1<V2, the output voltage VO reaches a final value in a short period of time.

Figure 8:
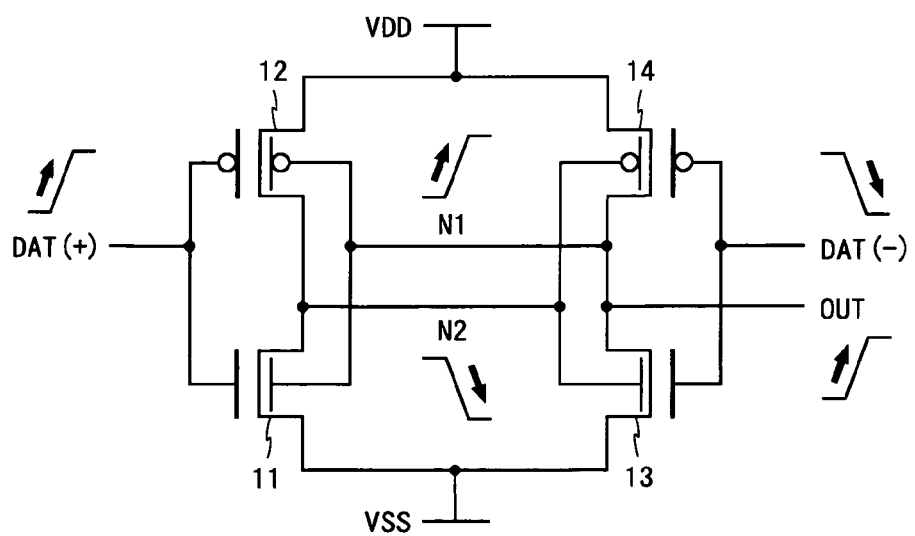
FIG. 8 is a diagram illustrating an operation of the comparator circuit illustrated in FIG. 1 when inputting the digital signal.

A case in which the first input voltage V1 changes to the high voltage VDD and the second input voltage V2 changes to the low voltage VSS when inputting the digital signals to the comparator circuit 10 (FIG. 7A) is considered as an example. In this case, as shown in FIG. 8, the voltage of the node N1 changes to the high voltage VDD, and the voltage of the node N2 changes to the low voltage VSS. The increase of the voltage of the node N1 causes the threshold voltage Vth of the inverter 16 to decrease, and facilitates the decrease of the output voltage of the inverter 16. Further, the decrease of the voltage of the node N2 causes the threshold voltage Vth of the inverter 15 to increase, and facilitates an increase of the output voltage of the inverter 15. Therefore, the output voltage VO reaches the high voltage VDD in a short period of time. Also in a case in which the first input voltage V1 changes to the low voltage VSS and the second input voltage V2 changes to the high voltage VDD, likewise, the output voltage VO reaches the low voltage VSS in a short period of time.

Figure 9A:
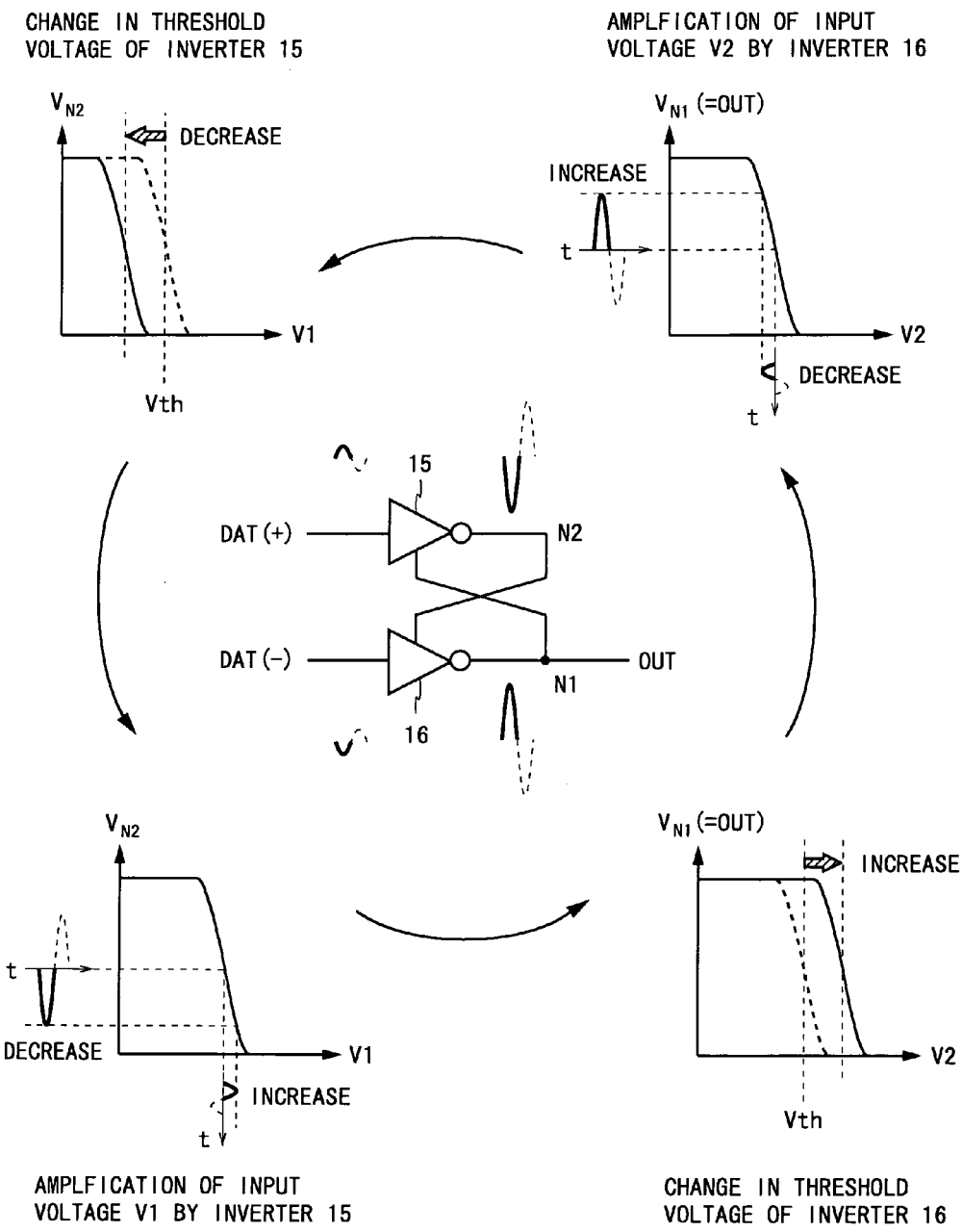
FIG. 9A is a diagram illustrating an operation of the comparator circuit illustrated in FIG. 1 when inputting the differential signal (when an output voltage increases).
Figure 9B:
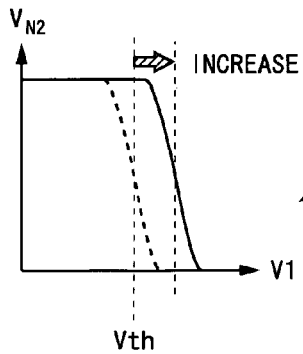
FIG. 9B is a diagram illustrating an operation of the comparator circuit illustrated in FIG. 1 when inputting the differential signal (when the output voltage decreases).
Figure 9B:
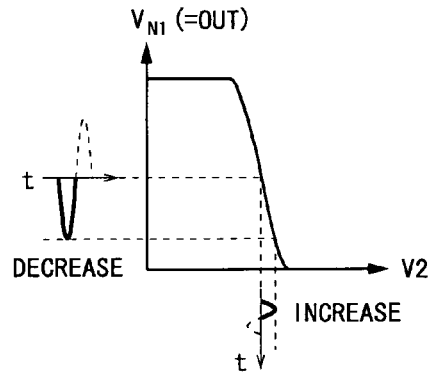
Figure 9B:
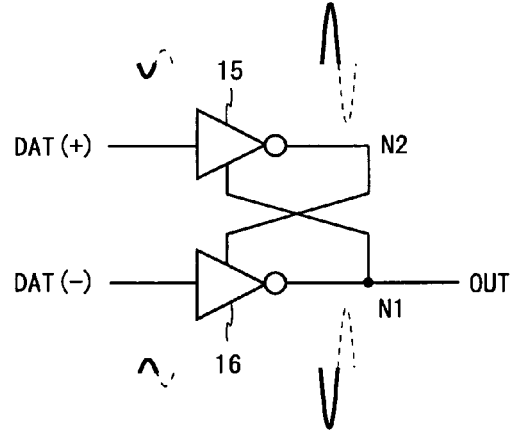
Figure 9B:
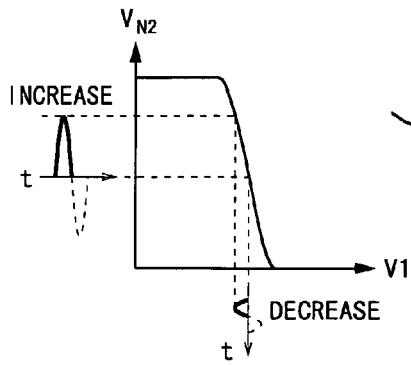
Figure 9B:
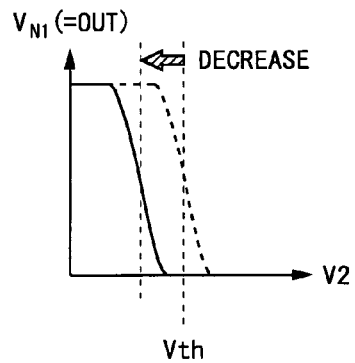

Further, when the differential signals with small amplitude (FIG. 7B) are inputted, the comparator circuit 10 operates as shown in FIGS. 9A and 9B. When the output voltage VO increases, the comparator circuit 10 operates as shown in FIG. 9A. As the first input voltage V1 increases, the voltage of the node N2 decreases to a large extent due to an action of amplification by the inverter 15 (left bottom in FIG. 9A). As a result, the threshold voltage Vth of the inverter 16 increases (right bottom in FIG. 9A), and the output voltage of the inverter 16 becomes easy to increase. Further, as the second input voltage V2 decreases, the voltage of the node N1 increases to a large extent due to an action of amplification by the inverter 16 (right top in FIG. 9A). As a result, the threshold voltage Vth of the inverter 15 decreases (left top in FIG. 9A), and the output voltage of the inverter 15 becomes easy to decrease.

When the output voltage VO decreases, the comparator circuit 10 operates as shown in FIG. 9B. As the first input voltage V1 decreases, the voltage of the node N2 increases to a large extent due to the action of amplification by the inverter 15 (left bottom in FIG. 9B). As a result, the threshold voltage Vth of the inverter 16 decreases (right bottom in FIG. 9B), and the output voltage of the inverter 16 becomes easy to decrease. Further, as the second input voltage V2 increases, the voltage of the node N1 decreases to a large extent due to the action of amplification by the inverter 16 (right top in FIG. 9B). As a result, the threshold voltage Vth of the inverter 15 increases (left top in FIG. 9B), and the output voltage of the inverter 16 becomes easy to increase.

In this manner, the first input voltage V1 is amplified by the inverter 15, and the signal amplified by the inverter 15 causes the threshold voltage Vth of the inverter 16 to change so as to facilitate a switching operation of the inverter 16. Along with this, the second input voltage V2 is amplified by the inverter 16, and the signal amplified by the inverter 16 causes the threshold voltage Vth of the inverter 15 to change so as to facilitate a switching operation of the inverter 15. The amplification of the first input voltage V1, the change in the threshold voltage of the inverter 16, the amplification of the second input voltage V2 and the change in the threshold voltage Vth of the inverter 15 are repeatedly carried out in an instantaneous manner, and accordingly the switching operations of the inverters 15 and 16 are facilitated at an accelerating pace. Therefore, the voltage of the output terminal OUT reaches the final value in a short period of time.

As described above, the comparator circuit 10 effectively uses a feedback by the negative feedback loop, and sequentially changes the threshold voltages of the two inverters 15 and 16 in a direction that is easy to be switched. A case in which the threshold voltage of the inverter 16 is smaller than a designed value due to a variation in a process is considered as an example. In this case, the inverter 16 does not carry out the switching operation easily even if the second input voltage V2 decreases. However, when the first input voltage V1 increases and the output voltage of the inverter 15 decreases, the threshold voltage of the inverter 16 dynamically increases, and the inverter 16 carries out the switching operation easily. Likewise, in a case in which the threshold voltage of the inverter 16 is greater than the designed value, the switching operation by the inverter 16 is facilitated by dynamically controlling the characteristic of the inverter 16 using an output from the inverter 15. This also applies to a case in which the threshold voltage of the inverter 15 is different from a designed value. In this manner, as the switching operation is facilitated in a complementary manner using the two inverters 15 and 16, the comparator circuit 10 is insusceptible to a variation in the threshold voltages of the transistors.

Further, the comparator circuit 10 is also insusceptible to fluctuation of the common mode voltage. A case in which the common mode voltage is lower than a normal level is considered as an example. In an initial state, the voltage of the node N2 (the output voltage of the inverter 15) does not decrease very much even if the first input voltage V1 increases. However, when the second input voltage V2 decreases, the voltage of the node N1 (the output voltage of the inverter 16) increases sufficiently. As a result, the threshold voltage of the inverter 15 decreases, and the switching operation of the inverter 15 is facilitated. Likewise, in a case in which the common mode voltage is higher than the normal level, when the voltage of the node N1 decreases, the threshold voltage of the inverter 15 increases, and the switching operation of the inverter 15 is facilitated. As described above, these changes are repeatedly carried out in an instantaneous manner, and accordingly the switching operations of the inverters 15 and 16 are facilitated in a complementary manner. With the above reasons, the comparator circuit 10 is also insusceptible to the fluctuation of the common mode.

Figure 10:
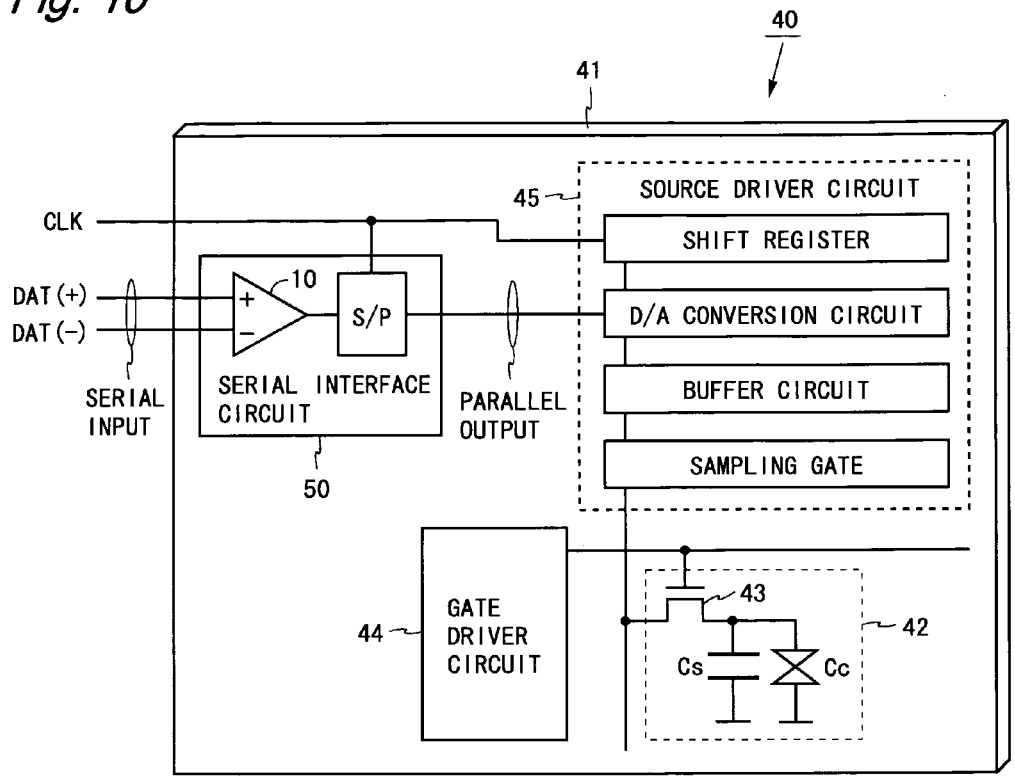
FIG. 10 is a block diagram illustrating a structure of a liquid crystal display device provided with the comparator circuit illustrated in FIG. 1.

The following describes a liquid crystal display device provided with the comparator circuit 10 at the input stage of the liquid crystal panel as one application mode of the comparator circuit 10. FIG. 10 is a block diagram illustrating a structure of the liquid crystal display device provided with the comparator circuit 10. A liquid crystal display device 40 illustrated in FIG. 10 is provided with a liquid crystal panel 41 in which a pixel circuit 42, a gate driver circuit 44, a source driver circuit 45, and a serial interface circuit 50 are integrally formed on a glass substrate. The circuits on the glass substrate are configured by TFTs made of such as low-temperature polysilicon and CG silicon.

The liquid crystal panel 41 is provided with a plurality of pixel circuits 42 each including a TFT 43, a liquid crystal capacitance Cc, and an auxiliary capacitance Cs (only one pixel circuit is shown in FIG. 10). Further, the liquid crystal panel 41 is provided with the gate driver circuit 44 and the source driver circuit 45 as drive circuits of the pixel circuits 42. The source driver circuit 45 includes a shift register, a D/A conversion circuit, a buffer circuit, and a sampling gate.

According to the liquid crystal display device 40, a serial interface is used for a signal input to the liquid crystal panel 41 in order to reduce the number of signal lines connected to the liquid crystal panel 41. Further, a differential signal is used for the signal input to the liquid crystal panel 41. Consequently, the liquid crystal panel 41 is provided with the serial interface circuit 50 and the comparator circuit 10 is provided for the input stage of the liquid crystal panel 41.

Figure 11:
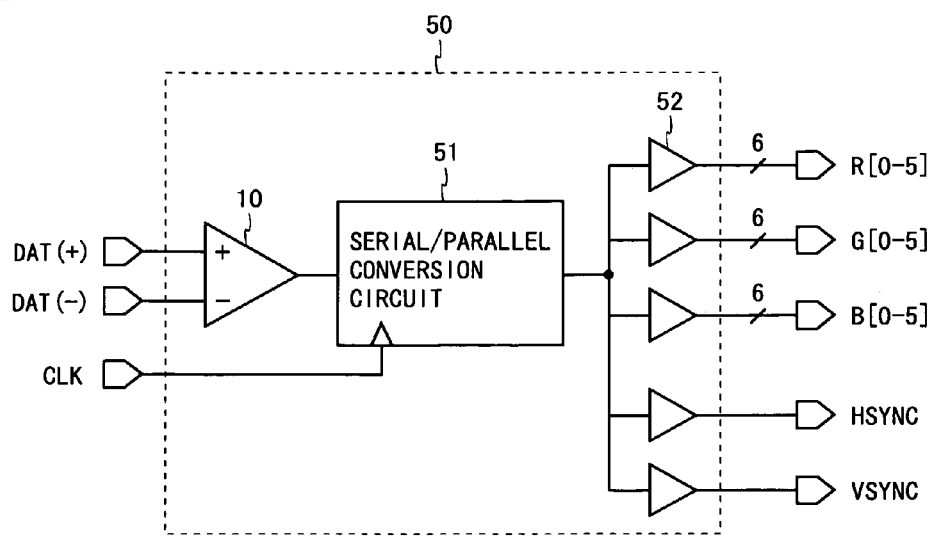
FIG. 11 is a diagram illustrating a detail of a serial interface circuit illustrated in FIG. 10.

FIG. 11 is a diagram illustrating a detail of the serial interface circuit 50. The serial interface circuit 50 illustrated in FIG. 11 includes the comparator circuit 10, a serial/parallel conversion circuit 51, and a plurality of buffers 52. The comparator circuit 10 compares the voltage supplied to the input terminal DAT(+) and the voltage supplied to the input terminal DAT(−), and outputs a result of the comparison. The serial/parallel conversion circuit 51 performs a serial/parallel conversion to signals sequentially outputted from the comparator circuit 10, and outputs the plurality of signals in parallel. The output signals from the serial/parallel conversion circuit 51 are outputted to such as the gate driver circuit 44 and the source driver circuit 45 through the buffers 52.

The serial interface circuit 50 illustrated in FIG. 11 outputs a red luminance signal R, a green luminance signal G, a blue luminance signal B (each of which is 6 bits), a horizontal synchronization signal HSYNC, and a vertical synchronization signal VSYNC (each of which is 1 bit) in parallel. It should be appreciated that the serial interface circuit 50 can output signals other than the signals listed above.

By providing the comparator circuit 10 that is insusceptible to the variation in the threshold voltages of the transistors and to the fluctuation of the common mode voltage of the input signal and capable of operating at a high speed for the serial interface circuit 50 thus formed on the liquid crystal panel 41, it is possible to configure the liquid crystal display device 40 capable of inputting signals to the liquid crystal panel 41 at a high speed using the differential signal. Further, by inputting the signals to the liquid crystal panel 41 using the serial interface, it is possible to reduce the number of the signal lines connected to the liquid crystal panel 41 and to improve reliability of the liquid crystal display device 40.

As described above, according to the comparator circuit 10 of this embodiment, the inverters 15 and 16 are configured by the double gate TFTs, and the bottom gate terminals of the double gate TFTs that configure the inverter 15 are connected to the output of the inverter 16 and the bottom gate terminals of the double gate TFTs that configure the inverter 16 are connected to the output of the inverter 15. With this, it is possible to control the threshold voltage of the inverter 15 based on the output of the inverter 16 so as to facilitate the switching operation of the inverter 15, and to control the threshold voltage of the inverter 16 based on the output of the inverter 15 so as to facilitate the switching operation of the inverter 16. Therefore, regardless of the threshold voltages of the transistors and the common mode voltage, the comparator circuit 10 can operate in a stable manner at a high speed.

Further, it is possible to form a comparator circuit in a planar shape that is insusceptible to the variation in the threshold voltages of the transistors and to the fluctuation of the common mode voltage of the input signal and capable of operating at a high speed when the inverters 15 and 16 included in the comparator circuit 10 are configured by the TFTs. In general, the variation in the characteristic of the TFT is greater than a variation in the characteristic of a transistor using a single-crystal silicon. Consequently, an effect of the comparator circuit 10 of operating in a stable manner at a high speed becomes more pronounced in the case in which the comparator circuit 10 is configured by the TFTs. The comparator circuit 10 providing such an effect can be utilized for the liquid crystal display device 40 and such, by integrally forming the comparator circuit 10 and the pixel circuits 42 on the liquid crystal panel 41 using the TFTs.

Second Embodiment

Figure 12:
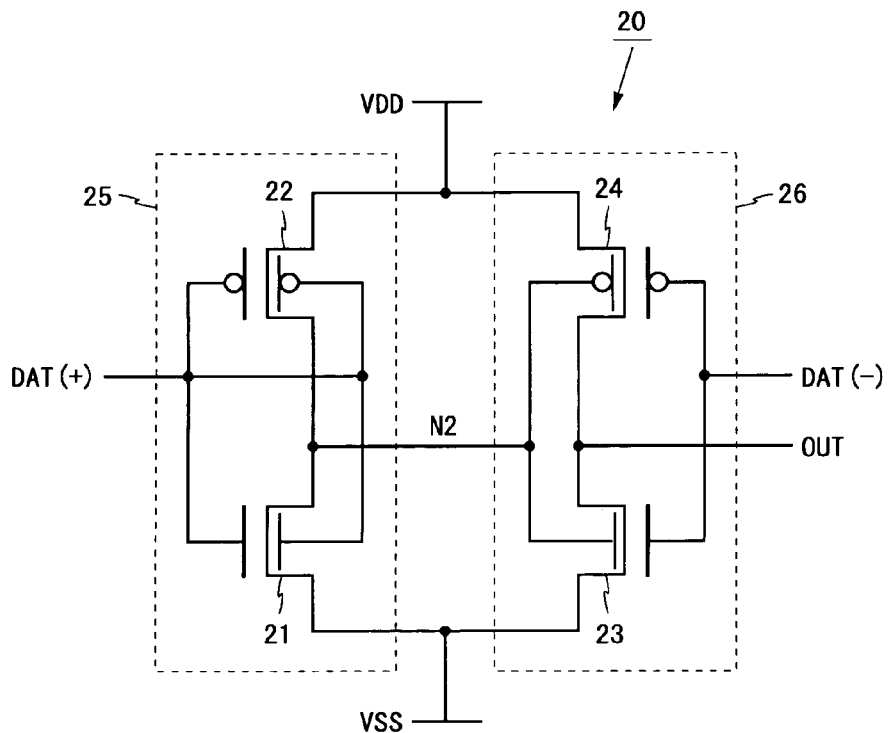
FIG. 12 is a circuit diagram of a comparator circuit according to a second embodiment of the present invention.

FIG. 12 is a circuit diagram of a comparator circuit according to a second embodiment of the present invention. A comparator circuit 20 illustrated in FIG. 12 is provided with four TFTs 21 to 24, two input terminals DAT (+) and DAT (−), and an output terminal OUT. The TFTs 21 and 23 are N-type double gate TFTs, and the TFTs 22 and 24 are P-type double gate TFTs. Bottom gate terminals of the TFTs 21 and 22 are both connected to top gate terminals of the TFTs 21 and 22 and the input terminal DAT (+). Other than this, the connection between the components of the comparator circuit 20 is the same as that of the comparator circuit 10.

In the comparator circuit 20, the TFTs 21 and 22 configure an inverter 25 and the TFTs 23 and 24 configure an inverter 26. An input terminal and an adjustment terminal of the inverter 25 are connected to the input terminal DAT (+), and an output terminal is connected to an adjustment terminal of the inverter 26. An input terminal of the inverter 26 is connected to the input terminal DAT (−), and an output terminal is connected to the output terminal OUT.

According to the comparator circuit 20, bottom gate terminals of the TFTs 21 and 22 are connected to the input terminal DAT (+) to which the first input voltage V1 is supplied instead of an output from the inverter 26. The output from the inverter 26 increases as the first input voltage V1 increases, and decreases as the first input voltage V1 decreases. Therefore, the comparator circuit 20 in which connecting targets of the bottom gate terminals of the TFTs 21 and 22 are modified from the output of the inverter 26 to the input terminal DAT (+) operates in the same manner as the comparator circuit 10 according to the first embodiment. The comparator circuit 20 is used in the same application mode as the comparator circuit 10. As the comparator circuit 20 facilitates the switching operation only in a single direction, the comparator circuit 20 is a little bit more susceptible to the variation in the threshold voltages of transistors and the fluctuation of the common mode voltage than the comparator circuit 10 that facilitates the switching operation in a complementary manner. However, in the comparator circuit 20, as the output terminal of the inverter 26 is not connected to the adjustment terminal of the inverter 25, a load accompanying the output from the inverter 26 becomes smaller than the case of the comparator circuit 10. Therefore, the comparator circuit 20 provides an advantageous effect that a current driving force of an output is higher than the case of the comparator circuit 10.

As described above, according to the comparator circuit 20 of this embodiment, the inverters 25 and 26 are configured by the double gate TFTs, and the bottom gate terminals of the double gate TFTs that configure the inverter 25 are applied with the first input voltage V1, and the bottom gate terminals of the double gate TFTs that configure the inverter 26 are connected to the output of the inverter 25. With this, it is possible to control the threshold voltage of the inverter 25 based on the input of the inverter 25 so as to facilitate a switching operation of the inverter 25, and to control the threshold voltage of the inverter 26 based on the output of the inverter 25 so as to facilitate a switching operation of the inverter 26. Therefore, the comparator circuit 20 can operate at a high speed.

Third Embodiment

Figure 13:
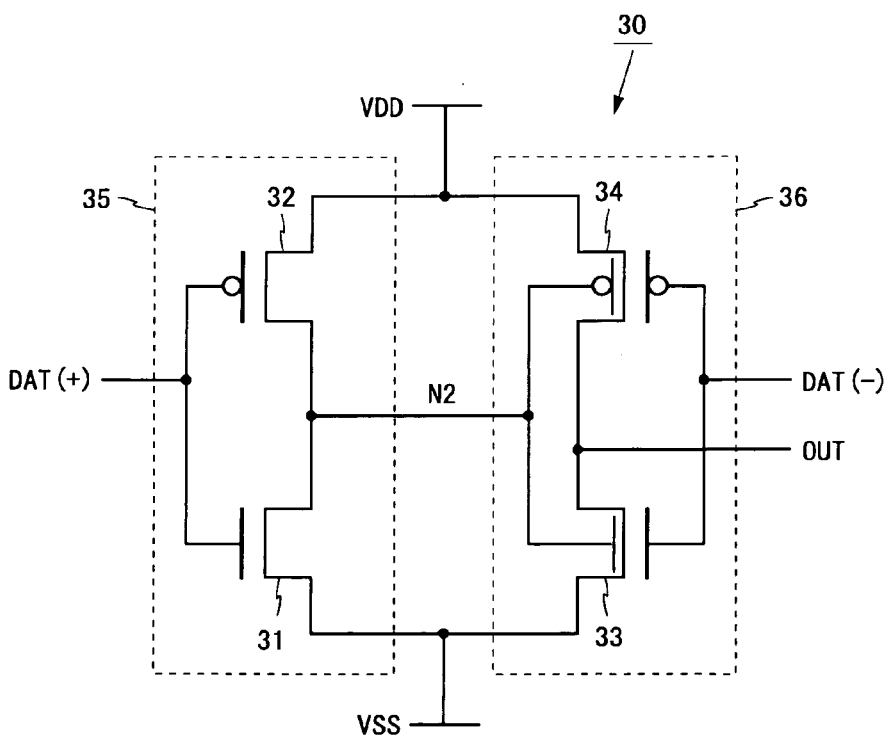
FIG. 13 is a circuit diagram of a comparator circuit according to a third embodiment of the present invention.

FIG. 13 is a circuit diagram of a comparator circuit according to a third embodiment of the present invention. A comparator circuit 30 illustrated in FIG. 13 is provided with four TFTs 31 to 34, two input terminals DAT(+) and DAT(−), and an output terminal OUT. The TFT 31 is an N-type single gate TFT, the TFT 32 is a P-type single gate TFT, the TFT 33 is an N-type double gate TFT, and the TFT 34 is a P-type double gate TFT. Gate terminals of the TFTs 31 and 32 are both connected to the input terminal DAT(+). Further, there is no wiring connecting to bottom gate terminals of the TFTs 31 and 32 in the comparator circuit 30. Other than this, the connection between the components of the comparator circuit 30 is the same as that of the comparator circuit 10.

In the comparator circuit 30, the TFTs 31 and 32 configure an inverter 35 and the TFTs 33 and 34 configure an inverter 36. An input terminal of the inverter 35 is connected to the input terminal DAT(+), and an output terminal is connected to an adjustment terminal of the inverter 36. An input terminal of the inverter 36 is connected to the input terminal DAT(−), and an output terminal is connected to the output terminal OUT.

According to the comparator circuit 30, similarly to the comparator circuit 10 according to the first embodiment, a threshold voltage of the inverter 36 is controlled based on an output of the inverter 35 so as to facilitate a switching operation of the inverter 36. However, as the inverter 35 is configured by the single gate TFTs, a threshold voltage of the inverter 35 is not controlled based on an output of the inverter 36. Other than this, the comparator circuit 30 operates in the same manner as the comparator circuit 10 according to the first embodiment. The comparator circuit 30 is used in the same application mode as the comparator circuit 10. Similarly to the comparator circuit 20 according to the second embodiment, while the comparator circuit 30 is a little bit more susceptible to the variation in the threshold voltages of transistors and the fluctuation of the common mode voltage than the comparator circuit 10, the comparator circuit 30 has a characteristic that a current driving force of an output is higher than the case of the comparator circuit 10.

As described above, according to the comparator circuit 30 of this embodiment, only the inverter 36 is configured by the double gate TFTs out of the inverters 35 and 36, and the bottom gate terminals of the double gate TFTs are connected to the output of the inverter 35. With this, it is possible to control the threshold voltage of the inverter 36 based on the input of the inverter 35 so as to facilitate the switching operation of the inverter 36. Therefore, the comparator circuit 30 can operate at a high speed. Further, according to the comparator circuit 30, it is possible to simplify the structure of the circuit compared to the comparator circuit 10 or 20.

As can be seen from the above description, the comparator circuit according to the present invention includes a first inverter to which a first input voltage is inputted, the first inverter having a structure in which a P-type transistor and an N-type transistor are connected in series between two power supply wires, and a second inverter to which a second input voltage is inputted, the second inverter having a structure that is identical with the structure of the first inverter, wherein at least one of the first and second inverters is configured by double gate TFTs each having two gate terminals, and the top gate terminal of each double gate TFT is applied with the input voltage and the bottom gate terminal is connected to an output of the other inverter. In this manner, by configuring at least one of the two inverters by the double gate TFTs and connecting the bottom gate terminals of the double gate TFTs to the output of the other inverter, it is possible to control a threshold voltage of the inverter configured by the double gate TFTs based on the output of the other inverter so as to facilitate a switching operation of the inverter, thereby causing the comparator circuit to operate at a high speed.

Further, according to the above description, in the double gate TFT, the threshold voltage Vth of the transistors controlled using the top gate terminals is changed by controlling the bottom gate voltage Vbg. However, in contrast, the threshold voltage Vth of the transistors controlled using the bottom gate terminals can be changed by controlling the top gate voltage Vtg. In this case, the above description can be applied by interchanging the top gate terminals and the bottom gate terminals.

Figure 14A:
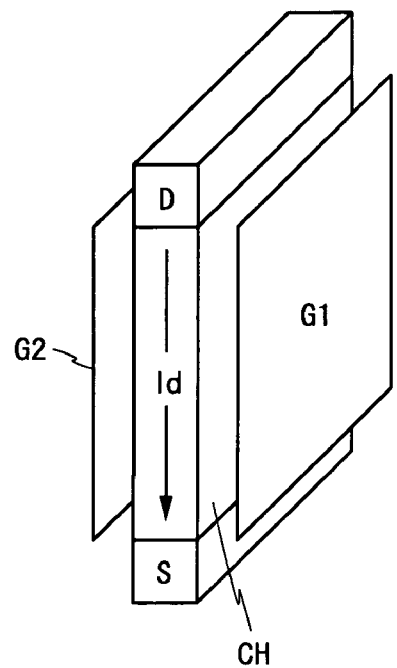
FIG. 14A is a schematic view illustrating a structure of a vertical double gate FET.
Figure 14B:
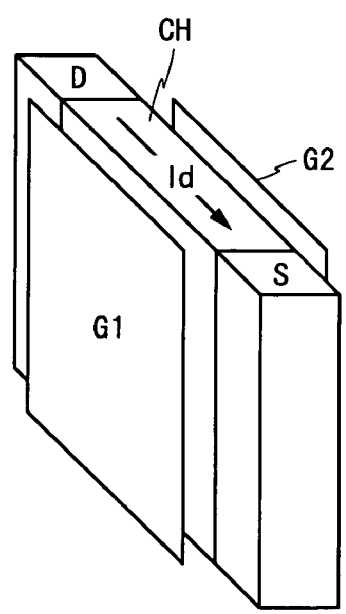
FIG. 14B is a schematic view illustrating a structure of a fin-type double gate FET.
Figure 15:
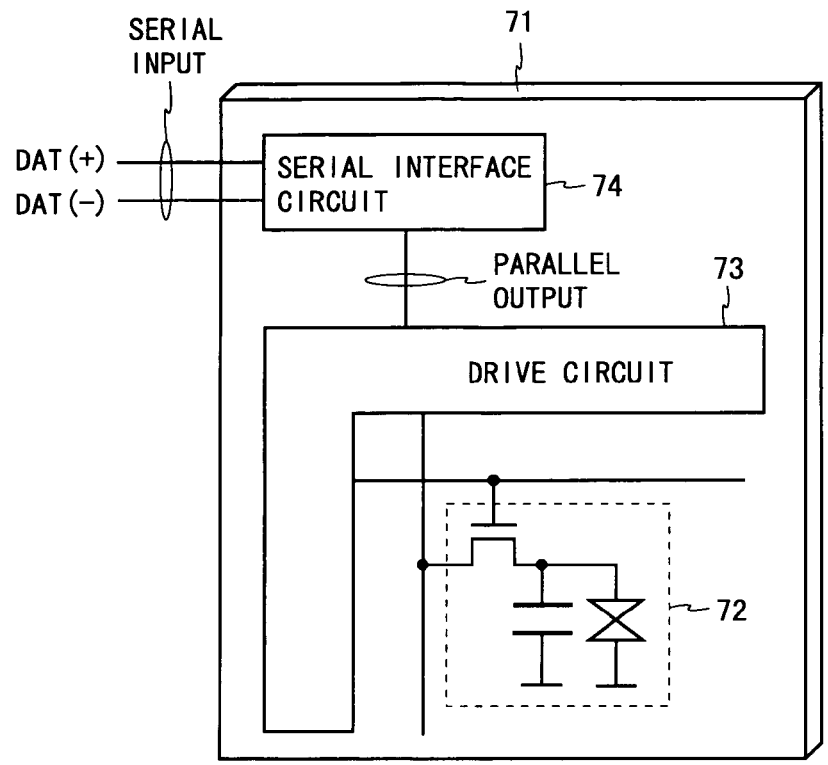
FIG. 15 is a block diagram illustrating a structure of a conventional liquid crystal display device.
Figure 16:
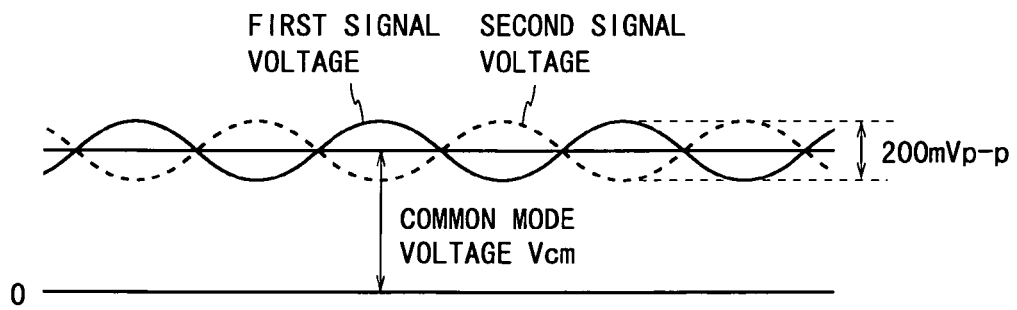
FIG. 16 is a signal waveform chart showing a signal used in LVDS.
Figure 17:
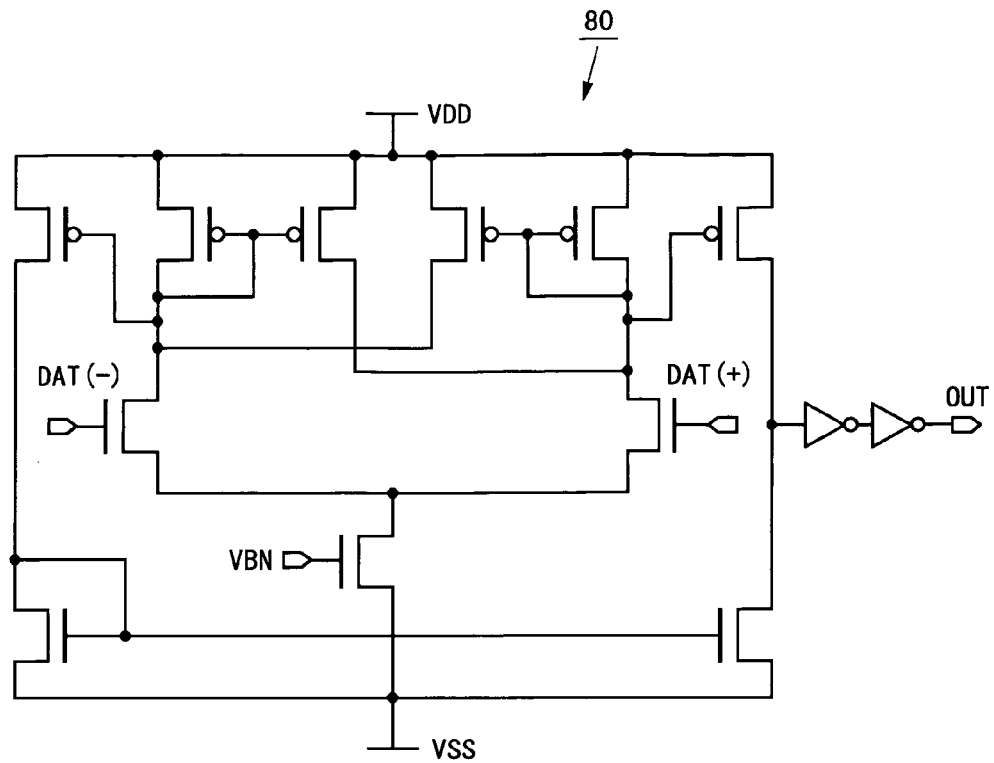
FIG. 17 is a circuit diagram of a conventional comparator circuit (first example).
Figure 18:
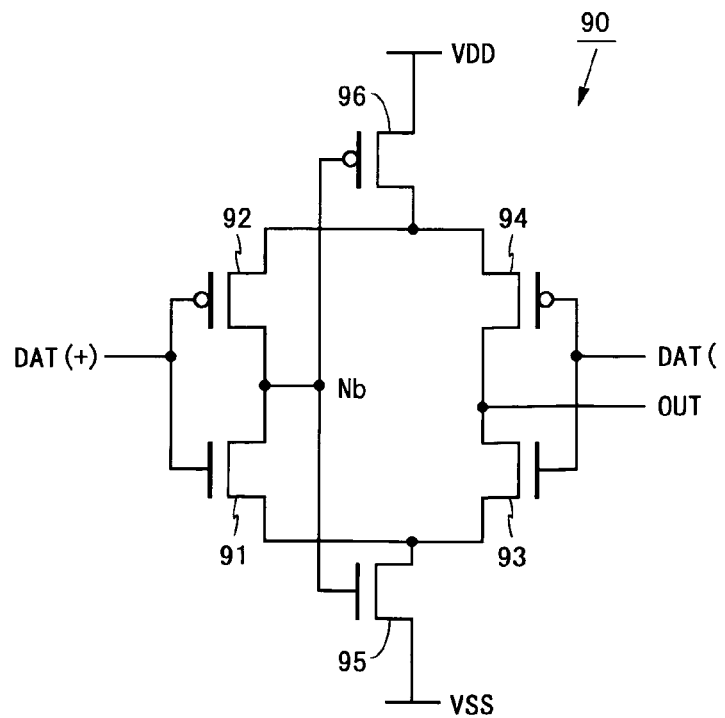
FIG. 18 is a circuit diagram of a conventional comparator circuit (second example).

Moreover, according to the above description, the comparator circuit of the present invention is configured by the TFTs. However, the comparator circuit of the present invention can be configured by MOSFETs or such. When configuring the comparator circuit of the present invention by MOSFETs, it is possible to use planar double gate FETs having the same structure as shown in FIG. 2, vertical double gate FETs (FIG. 14A), or fin-type double gate FETs (FIG. 14B). In the case of the vertical double gate FETs, the drain current Id flows in a vertical direction as shown in FIG. 14A. In the case of the fin-type double gate FETs, the drain current Id flows in a horizontal direction as shown in FIG. 14B. In the case of these two types of the double gate FETs, a first gate terminal G1 and a second gate terminal G2 are provided along two opposing side surfaces of the channel forming portion CH. When using these two types of the double gate FETs, the above description can be applied by reading the top gate terminal as the first gate terminal and the bottom gate terminal as the second gate terminal.

INDUSTRIAL APPLICABILITY

A comparator circuit according to the present invention is insusceptible to a variation in threshold voltages of transistors and fluctuation of a common mode voltage of an input signal, and is capable of operating at a high speed, and accordingly, can be used in various applications in which two input voltages are compared such as an interface circuit of a display device. The display device according to the present invention can be used as various display devices such as a liquid crystal display device.

The invention claimed is:

1. A comparator circuit capable of comparing two input voltages, the circuit comprising:
   a first inverter to which a first input voltage is inputted, the first inverter having a structure in which a P-type transistor and an N-type transistor are connected in series between two power supply wires; and
   a second inverter to which a second input voltage is inputted, the second inverter having a structure that is identical with the structure of the first inverter, wherein
   at least one of the first and second inverters is configured by double gate transistors each having two gate terminals, and one of the gate terminals of each double gate transistor is applied with the input voltage and the other of the gate terminals is connected to an output of the other inverter.

2. The comparator circuit according to claim 1, wherein
   each of the first and second inverters is configured by the double gate transistors,
   one of the gate terminals of each double gate transistor that configures the first inverter is applied with the first input voltage, and the other of the gate terminals is connected to an output of the second inverter, and
   one of the gate terminals of each double gate transistor that configures the second inverter is applied with the second input voltage, and the other of the gate terminals is connected to an output of the first inverter.

3. The comparator circuit according to claim 1, wherein
each of the first and second inverters is configured by the double gate transistors,
both of the two gate terminals of each double gate transistor that configures the first inverter are applied with the first input voltage, and
one of the gate terminals of each double gate transistor that configures the second inverter is applied with the second input voltage, and the other of the gate terminals is connected to an output of the first inverter.

4. The comparator circuit according to claim 1, wherein
only the second inverter out of the first and second inverters is configured by the double gate transistors, and
one of the gate terminals of each double gate transistor that configures the second inverter is applied with the second input voltage, and the other of the gate terminals is connected to an output of the first inverter.

5. The comparator circuit according to claim 1, wherein
each of the first and second inverters is configured by thin-film transistors.

6. The comparator circuit according to claim 5, wherein
each of the first and second inverters is configured by using the thin-film transistors on a substrate on which a pixel circuit is disposed.

7. A display device formed on a substrate, the device comprising:
a plurality of pixel circuits;
a drive circuit for the pixel circuits; and
an interface circuit that converts an externally inputted differential signal into a non-differential signal, and outputs the non-differential signal to the drive circuit, wherein
the interface circuit includes a comparator circuit according to claim 1 and performs conversion of the differential signal using the comparator circuit.

* * * * *